United States Patent
Lung

(10) Patent No.: US 7,682,868 B2
(45) Date of Patent: *Mar. 23, 2010

(54) METHOD FOR MAKING A KEYHOLE OPENING DURING THE MANUFACTURE OF A MEMORY CELL

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 148 days.

This patent is subject to a terminal disclaimer.

(21) Appl. No.: 11/567,314

(22) Filed: Dec. 6, 2006

(65) Prior Publication Data

US 2008/0138930 A1    Jun. 12, 2008

(51) Int. Cl.
*H01L 45/00* (2006.01)
(52) U.S. Cl. ............................... 438/102; 257/E45.002
(58) Field of Classification Search ................. 438/102, 438/595, 596, 68, 672, 674, 675; 257/E45.002
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Hoppe et al. |
| 5,534,712 A | 7/1996 | Ovshinsky et al. |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Matthew Smith
*Assistant Examiner*—Walter H Swanson
(74) *Attorney, Agent, or Firm*—Haynes Beffel & Wolfeld LLP

(57) ABSTRACT

A keyhole opening is formed during one example of manufacturing a memory cell. An upper layer is formed on a base layer, the base layer having a bottom electrode. The upper layer includes a second layer formed over the base layer and a first layer formed over the second layer. A keyhole opening is formed through the upper layer to expose a surface of the bottom electrode and to create a first memory cell subassembly. The keyhole opening comprises a first, upper opening segment formed within the first layer and a second opening segment formed within the second layer, the first and second opening segments having first and second widths. The first layer has an overhanging portion extending into the opening so that the first width is shorter than the second width.

25 Claims, 4 Drawing Sheets

U.S. PATENT DOCUMENTS

| | | |
|---|---|---|
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,423,626 B1 * | 7/2002 | Srinivasan et al. ......... 438/618 |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2004/0248339 A1 | 12/2004 | Lung |
| 2005/0019975 A1* | 1/2005 | Lee et al. ..................... 438/95 |
| 2005/0029502 A1 | 2/2005 | Hudgens |
| 2005/0093022 A1 | 5/2005 | Lung |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |

| | | |
|---|---|---|
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0166981 A1* | 7/2007 | Furukawa et al. ............ 438/597 |
| 2007/0173019 A1 | 7/2007 | Ho et al. |
| 2007/0173063 A1 | 7/2007 | Lung |
| 2007/0176261 A1 | 8/2007 | Lung |
| 2008/0138929 A1* | 6/2008 | Lung ........................... 438/102 |
| 2008/0138931 A1* | 6/2008 | Lung ........................... 438/102 |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.
Ahn, S.J. et al., "A Highly Manufacturable High Density Phase Change Memory of 64 Mb and Beyond," IEEE IEDM 2004, pp. 907-910.
Axon Technologies Corporation paper: Technology Description, pp. 1-6. Date : unavailable.
Bedeschi, F. et al., "4-MB MOSFET-Selected Phase-Change Memory Experimental Chip," IEEE, 2004, 4 pp.
Blake thesis, "Investigation of GeTeSb5 Chalcogenide Films for Use as an Analog Memory," AFIT/GE/ENG/00M-04, Mar. 2000, 121 pages.
Chen, An et al., "Non-Volatile Resistive Switching for Advanced Memory Applications," IEEE IEDM , Dec. 5-7, 2005, 4 pp.
Cho, S. L. et al., "Highly Scalable On-axis Confined Cell Structure for High Density PRAM beyond 256Mb," 2005 Symposium on VLSI Technology Digest of Technical Papers, pp. 96-97.
Gibson, G. A. et al, "Phase-change Recording Medium that Enables Ultrahigh-density Electron-beam Data Storage," Applied Physics Letter, 2005, 3 pp., vol. 86.
Gill, Manzur et al., "A High-Performance Nonvolatile Memory Technology for Stand-Alone Memory and Embedded Applications," 2002 IEEE-ISSCC Technical Digest (TD 12.4), 7 pp.
Ha, Y. H. et al., "An Edge Contact Type Cell fro Phase Change RAM Featuring Very Low Power Consumption," 2003 Symposium on VLSI Technology Digest of Technical Papers, pp. 175-176.
Happ, T. D. et al., "Novel None-Mask Self-Heating Pillar Phase Change Memory," 2006 Symposium on VLSI Technology, 2 pp.
Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.
Horii, H. et al., "A Novel Cell Technology Using N-doped GeSbTe Films for Phase Change RAM," 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.
Iwasaki, Hiroko et al., "Completely Erasable Phase Change Optical Disk," Jpn. J. Appl, Phys., Feb. 1992, pp. 461-465, vol. 31.
Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.
Kim, Kinam et al., "Reliability Investigations for Manufacturable High Density PRAM," IEEE $43^{rd}$ Annual International Reliability Physics Symposium, San Jose, 2005, pp. 157-162.
Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.
Lai, Stefan, "Current Status of the Phase Change Memory and its Future," IEEE IEDM 2003, pp. 255-258.
Lai, Stephan et al., OUM-A 180 nm Nonvolatile Memory Cell Element Technology for Stand Alone and Embedded Applications, IEEE IEDM 2001, pp. 803-806.
Lankhorst, Martijn H. R., et al; Low-Cost and Nanoscale Non-Volatile Memory Concept for Future Silicon Chips, Mar. 13, 2005,6 pp., Nature Materials Advance Online Publication, www.nature.com/naturematerials.
"Magnetic Bit Boost," www.sciencenews.org, Dec. 18 & 25, 2004, p. 389, vol. 166.
Mott, Nevill, "Electrons in Glass," Nobel Lecture, Dec. 8, 1977, Physics, 1977, pp. 403-413.
"New Memories Tap Spin, Gird for Battle," Science News, Apr. 3, 1999, p. 223, vol. 155.
Ovonyx Non-Confidential paper entitled "Ovonic Unified Memory," Dec. 1999, pp. 1-80.
Ovshinsky, Sandford R., "Reversible Electrical Switching Phenomena in Disordered Structures," Physical Review Letters, vol. 21, No. 20, Nov. 11, 1968, pp. 1450-1453.
Owen, Alan E. et al., "Electronic Conduction and Switching in Chalcogenide Glasses," IEEE Transactions on Electron Devices, vol. Ed. 20, No. 2, Feb. 1973, pp. 105-122.
Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.
Pirovano, Agostino et al., "Reliability Study of Phase-Change Nonvolatile Memories," IEEE Transactions on Device and Materials Reliability, Sep. 2004, pp. 422-427, vol. 4, No. 3.
Prakash, S. et al., "A Guideline for Designing Chalcogenide-Based Glasses for Threshold Switching Characteristics," IEEE Electron Device Letters, vol, 18, No. 2, Feb. 1997, pp. 45-47.
Radaelli, A. et al., "Electronic Switching Effect and Phase-Change Transition in Chalcogenide Materials," IEEE Electron Device Letters, Oct. 2004, pp. 684-686, vol. 25, No. 10.
"Remembering on the Cheap," www.sciencenews.org, Mar. 19, 2005, p. 189, vol. 167.
Rochefort, C. et al., "Manufacturing of High Aspect-Ration p-n Junctions Using Vapor Phase Doping for Application in Multi-Resurf Devices," IEEE 2002.
Strauss, Karl F. et al., "Overview of Radiation Tolerant Unlimited Write Cycle Non-Volatile Memory," IEEE 2000.
Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.
Wicker, Guy et al., Nonvolatile, High Density, High Performance Phase Change Memory, 1999, http://klabs.org/richcontent/MAPLDCon99/Papers/P21_Tyson_P.
PDF#search='nonvolatile%20high%20density%20high%20performance%20phase%20change%20memory', 8 pages.
Wicker, Guy, "A Comprehensive Model of Submicron Chalcogenide Switching Devices," Doctoral Dissertation, Wayne State University, Detroit, MI, 1996.
Wolf, Stanley, Excerpt from: Silicon Processing for the VLSI Era-vol. 4, pp. 674-679, 2004.
Wuttig, Matthias, "Towards a Universal Memory?" Nature Materials, Apr. 2005, pp. 265-266, vol. 4.
Yi, J. H. et al., "Novel Cell Structure of PRAM with Thin Metal Layer Inserted GeSbTe," IEEE IEDM 2003, 4 pages.
Yonehara, T. et al., "Control of Grain Boundary Location by Selective Nucleation Over Amorphous Substrates," Mat. Res. Soc. Symp. Proc., vol. 106, 1998, pp. 21-26.
Ahn, S. J. et al., "Highly Reliable 5nm Contact Cell Technology for 256Mb PRAM," VLSI Technology, Digest of Technical Papers, Jun. 14-16, 2005, pp. 98-99.

* cited by examiner

METHOD FOR MAKING A KEYHOLE OPENING DURING THE MANUFACTURE OF A MEMORY CELL

CROSS-REFERENCE TO OTHER APPLICATIONS

This application is related to the following US patent applications, each filed on the same day as this application, assigned to the same assignee and having the same inventor: Method for Making a Self-Converged Void and Bottom Electrode for Memory Cell, U.S application Ser. No. 11/567,326 and Method for Making a Self-Converged Memory Material Element for Memory Cell, U.S application Ser. No. 11/567,300.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example resistor random access memory (RRAM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell. One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material, This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

BRIEF SUMMARY OF THE INVENTION

One example of a method for creating a keyhole opening during the manufacture of a memory cell comprises forming a base layer, having a bottom electrode, and forming an upper layer on the base layer. The upper layer forming step comprises forming a second layer over the base layer and a first layer over the second layer. A keyhole opening is formed through the upper layer to expose a surface of the bottom electrode and to create a first memory cell subassembly. The keyhole opening comprises a first, upper opening segment formed within the first layer and a second opening segment formed within the second layer, the first and second opening segments having first and second widths. The first layer has an overhanging portion extending into the opening so that the first width is shorter than the second width.

Another example of a method for creating a keyhole opening during the manufacture of a memory cell comprises forming a base layer having a bottom electrode. Materials for first and second layers that increase and decrease their respective volumes when subjected to a chosen process are selected. An upper layer is formed on the base layer with the second layer formed over the base layer and the first layer formed over the second layer. An opening is formed through the upper layer to expose a surface of the bottom electrode and to create a first memory cell subassembly. The opening comprises a first, upper opening segment formed within the first layer and a second opening segment formed within the second layer, the first and second opening segments having first and second widths. The first memory cell subassembly is subjected to the chosen process thereby increasing the volume of the first layer and creating an overhanging portion extending into the opening while not increasing the volume of the second layer. The overhanging portion decreases the size of the first opening segment to create a decreased size, keyhole opening. The first opening segment has a decreased first width, the decreased first width being shorter than the second width by an overhang dimension, the overhang dimension being no more than 10% of the second width. In some examples silicon is selected for the first layer and the chosen process is an oxidation process so to increase the volume of the silicon first layer.

Other features, aspects and advantages of the present invention can be seen on review of the figures, the detailed description, and the claims which follow.

BRIEF DESCRIPTION OF THE DRAWINGS

FIG. 1 is a simplified side view of a first memory cell subassembly including a base layer and an upper layer with an opening formed in the upper layer;

FIG. 2 illustrates the results of an oxidation step on the structure of FIG. 1 to create a decreased size, keyhole opening;

FIG. 3 shows a result of m oxide deposition step with a self aligning void within the decreased size opening of FIG. 2;

FIG. 4 shows the results of etching the structure of FIG. 3 to create an electrode hole opening extending to a bottom electrode of the base layer;

FIG. 5 shows memory material deposited onto the structure of FIG. 4 including into the electrode hole opening of FIG. 4;

FIG. 6 shows the structure of FIG. 5 after chemical mechanical polishing to create a memory material element from the memory material within the electrode hole opening; and FIG. 7 shows a top electrode formed on the memory material element.

DETAILED DESCRIPTION OF THE INVENTION

Figure 1:
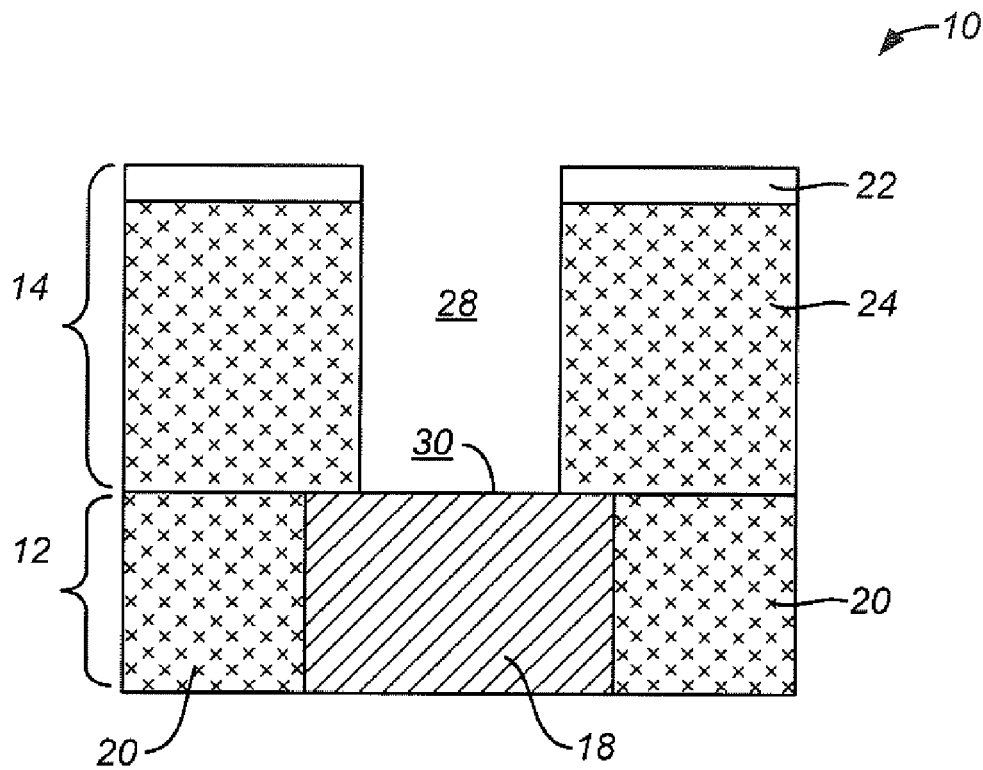
FIGS. 1-7 illustrate stages in one example of a manufacturing process according to the invention.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified side view of a first memory cell subassembly 10 including a base layer 12 and an upper layer 14. Base layer 12 includes a bottom electrode 18 within an oxide layer 20. Bottom electrode 18 is typically made of TiN or tungsten while oxide layer 20 is typically made of silicon dioxide ($SiO_2$); other materials could also be used for oxide layer 20. Bottom electrode 18 is connected to appropriate isolation devices, such as transistors or diodes. Upper layer 14 comprises a first layer 22 and a second layer 24 with the second layer being adjacent to base layer 12. In some embodiments second layer 24 acts as a planarization stop layer. In this embodiment first layer 22 is silicon, preferably polysilicon and second layer 24 is an oxide such as $SiO_2$.

An opening 28 is formed through upper layer 14 to expose a surface 30 of bottom electrode 18, typically by lithographic techniques. As will be discussed in more detail below, it is preferred that the width or diameter of opening 28 be a minimum size opening based upon the minimum feature size of the process used, typically a minimum lithographic feature size, to create the opening. Using conventional lithographic techniques, the width or diameter of opening 28 will typically be about 90 nm and will typically vary about +/−10%, that is about +/−9 nm.

Figure 2:
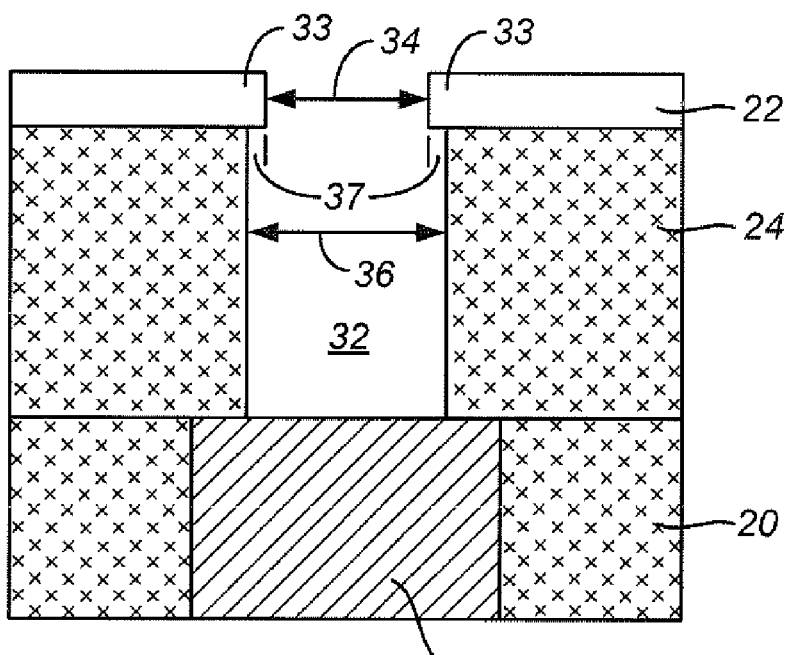

FIG. 2 illustrates the results of an oxidation step on the structure of FIG. 1 to create a decreased size, keyhole opening 32. The reduction in size of opening 28 is created by choosing a process step that will deposit material on or react with first layer 22 so to increase the volume of first layer 22. This creates overhang portion 33 while effectively not increasing the volume of second layer 24. Keyhole opening 32 has a decreased first width 34 measured at first layer 22 and a second width 36 measured at second layer 24. The size of overhang portion 33 is equal to the difference between widths 36 and 34, termed overhang dimension 37. The widths are average widths. One process that may be used when first layer 22 is made of polysilicon and second layer 24 is made of $SiO_2$ is chemical vapor deposition (CVD).

The use of silicon, or some other appropriate material, for first layer 22 permits the formation of keyhole opening 32 without resorting to the conventional technique of removing material from second layer 24. Overhang portion 33 of layer 22 creates a smaller keyhole opening 32 than is possible with conventional techniques. That is, width 34 of keyhole opening 32 can be a sub lithographic width while with conventional techniques the keyhole opening is typically a minimum lithographic width. In some embodiments overhang dimension 37 is no more than about 10% of width 36.

Figure 3:
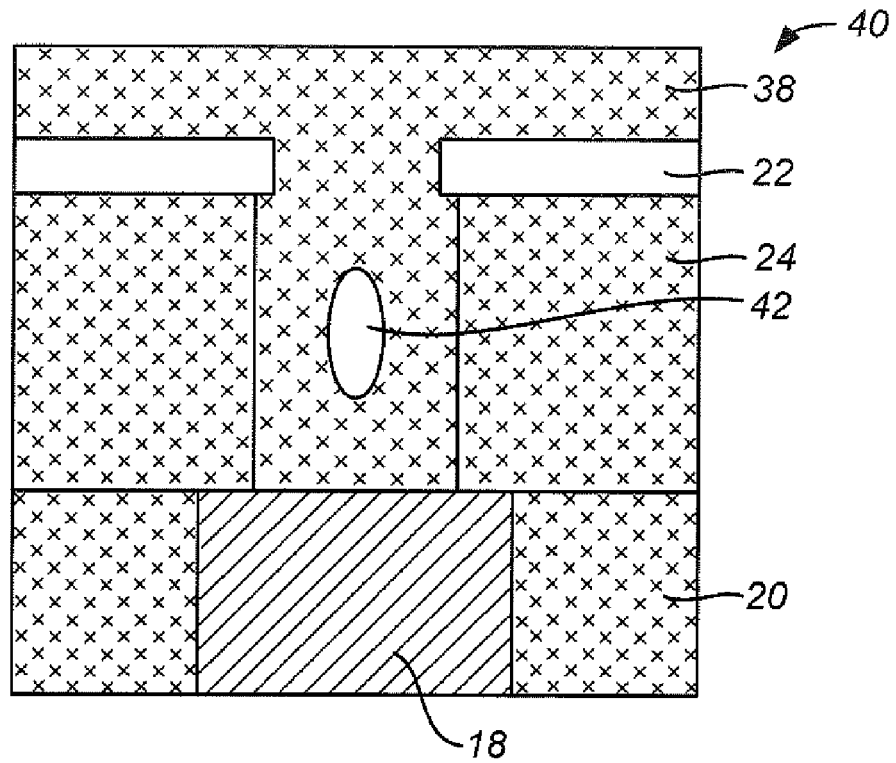

FIG. 3 shows a result of atomic layer deposition (ALD) of a dielectric material 38, typically $SiO_2$, to create a second memory cell subassembly 40. Other materials such as SiN or silicon oxynitride ($Si_2N_2O$) could also be used as dielectric material 38 and other procedures, such as CVD or low-pressure chemical vapor deposition (LPCVD) could be used to deposit dielectric material 38. This deposition creates a self aligning void 42 within the dielectric material 38 in keyhole opening 32. The lateral size or width of void 42 is smaller than would typically be achieved without the oxidation step of FIG. 2 creating the decreased size opening 32. In this way the size of void 42 can be primarily controlled by controlling the size of overhanging portion 33 rather than controlling the size of the originally formed opening 28.

Figure 4:
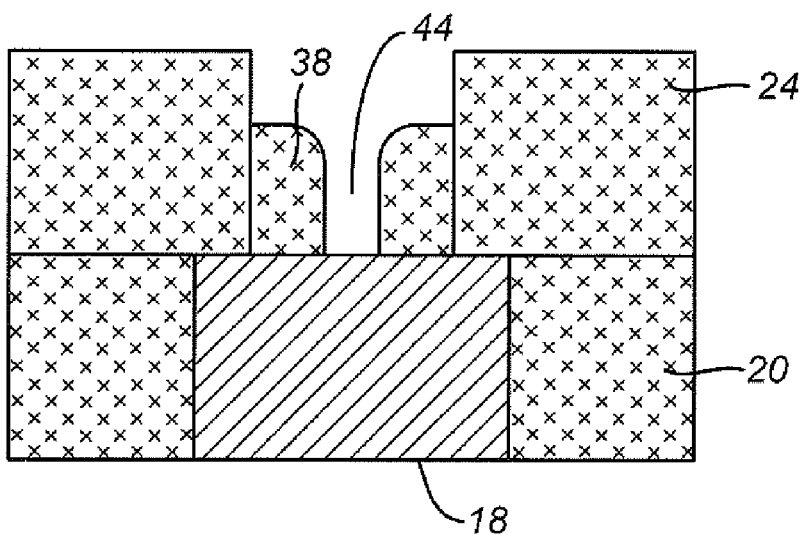

The structure of FIG. 3 is then etched, see FIG. 4, preferably using an anisotropic etching process, to remove first layer 22, a portion of dielectric material 38, and a portion of second layer 24. Doing so creates a sidewall of dielectric material 38 and an electrode hole opening 44 extending to surface 30 of bottom electrode 18. The diameter or width of electrode hole opening 44 is also smaller than would typically be achieved if it were not for the oxidation step of FIG. 2 creating the reduced size void 42 shown in FIG. 3.

Overhang dimension 37 is not controlled by the technique for forming opening 28. Rather, the size of overhang portion 33, and thus overhang dimension 37, is determined by the volume changing process used. If overhang dimension 37 is about 15 nm and opening 28 is about 90 nm, with a typical 10% variance overhang dimension 37 will have a variance of about +/−1.5 nm, substantially less than the typical variance of +/−9 nm for opening 28. Therefore, the variance in the diameter or width of void 42 will be less than if it were based upon the original diameter or width of opening 28. Accordingly, both void 42 and opening 44 have self-converging widths and can be considered to be a self-converged void 42 and a self-converged electrical hole opening 44, respectively.

Figure 5:
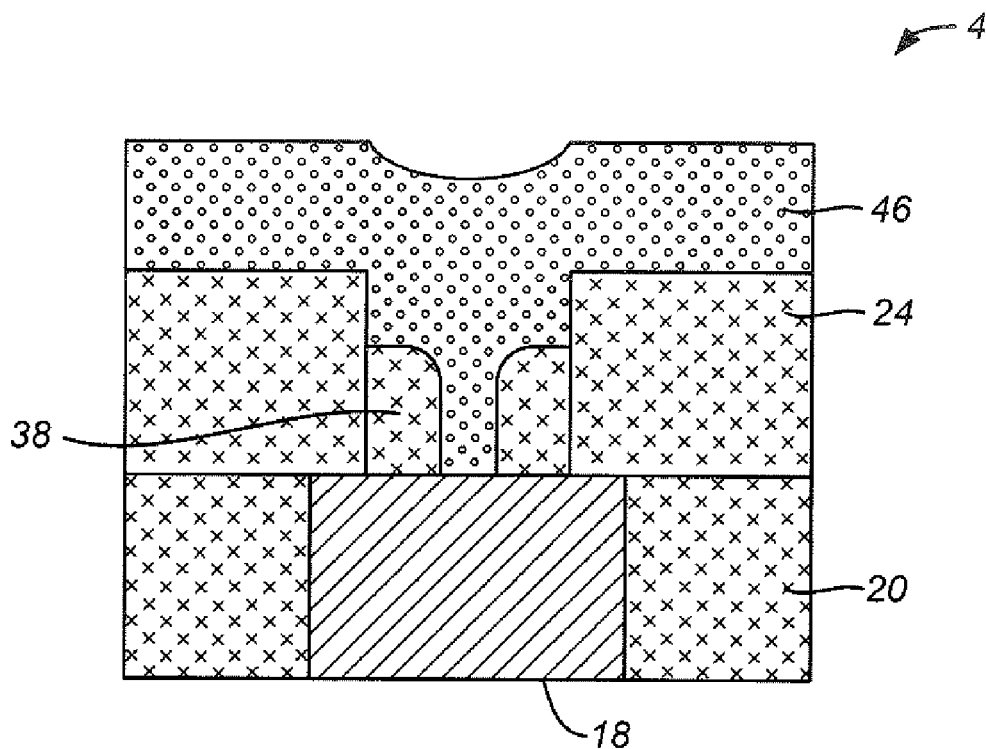

A memory material 46 is deposited on the structure of FIG. 4 to create the third memory cell subassembly 48 of FIG. 5. Memory material 46 is shown to fill the electrode hole opening 44 of FIG. 4. Memory material 46 is preferably a resistive type memory material, and more preferably is a phase change material such as GST.

Figure 6:
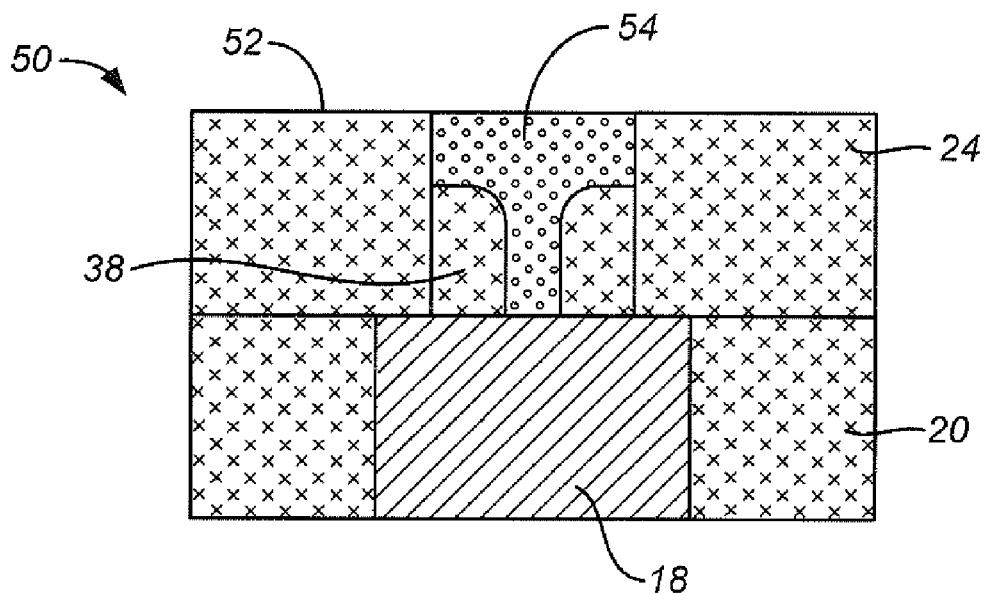

FIG. 6 shows third memory cell subassembly 48 of FIG. 5 after a planarization, material removal procedure, preferably a chemical mechanical polishing procedure, to create a fourth memory cell subassembly 50. This material removal step is carried out to stop at second layer 24 and create a flat outer surface 52. Doing so creates a memory material element 54 surrounded by dielectric material 38. The diameter or width of memory material element 54 at bottom electrode 18 is substantially less than the minimum lithographic feature size used to create opening 28, preferably less than 50% and more preferably less than 30% of the minimum lithographic feature size. For example, if the minimum lithographic feature size used to create opening 28 is 90 nm, diameter or width of memory material element 54 at bottom electrode 18 is preferably at most about 45 nm, and more preferably at most about 30 nm.

Figure 7:
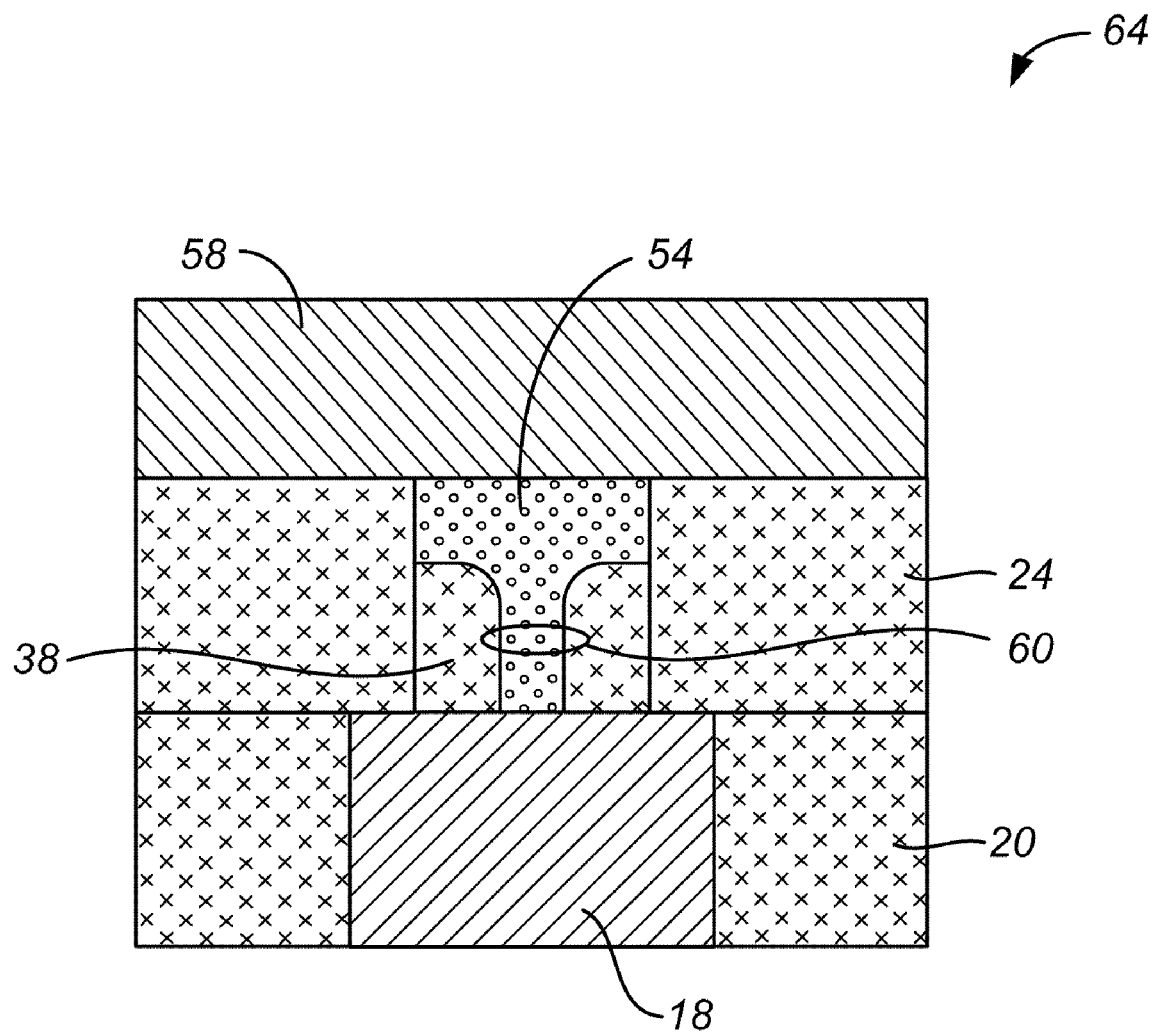

A top electrode 58 is shown in FIG. 7 formed on surface 52 of fourth memory cell subassembly 50 contacting memory material element 54. Top electrode 58 is typically TiN, although other electrode materials such as TiAl may also be used. Also illustrated in FIG. 7 is a phase change region 60. As discussed above, the magnitude of the reset current needed for reset of a phase change type of memory material element 54 can be reduced by reducing the size of memory material element 54 thus reducing the size of phase change region 60. This results in higher current densities being achieved at phase change region 60 with small absolute current values through memory material element 54.

In some embodiments, first and second layers 22, 24 must be sufficiently different to create the overhanging portion 33 of first layer 22 of FIG. 2. Subject to these as well as other requirements for different embodiments, various dielectric materials may comprise an electrical insulator including one or more elements selected from the group consisting of Si, Ti, Al, Ta, N, O, and C. In preferred devices, dielectric material 38 has a low thermal conductivity, less than about 0.014 J/cm*K*sec. In other preferred embodiments, when memory material element 58 is made from a phase change material, the thermally insulating dielectric material 38 may have a thermal conductivity less than that of the amorphous state of the phase change material, or less than about 0.003 J/cm*K*sec for a phase change material comprising GST. Representative thermally insulating materials include materials that are a combination of the elements silicon Si, carbon C, oxygen O, fluorine F, and hydrogen H. Examples of thermally insulating materials which are candidates for use for the thermally insulating dielectric material 38 include $SiO_2$, SiCOH, polyimide, polyamide, and fluorocarbon polymers. Other examples of materials which are candidates for use for the thermally insulating dielectric material 38 include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within dielectric material 38 can provide thermal and electrical insulation.

Useful characteristics of a programmable resistive type of memory material, like a phase change material, include the material having a resistance which is programmable, and preferably in a reversible manner, such as by having at least two solid phases that can be reversibly induced by electrical current. These at least two phases include an amorphous phase and a crystalline phase. However, in operation, the programmable resistive material may not be fully converted to either an amorphous or crystalline phase. Intermediate phases or mixtures of phases may have a detectable difference in material characteristics. The two solid phases should generally be bistable and have different electrical properties. The programmable resistive material may be a chalcogenide material. A chalcogenide material may include GST. In following sections of the disclosure, the phase change or other memory material is often referred to as GST, and it will be understood that other types of phase change materials can be used. A material useful for implementation of a memory cell as described herein is $Ge_2Sb_2Te_5$.

A memory cell 64 as described herein is readily manufacturable using standard lithography and thin film deposition technologies, without requiring extraordinary steps to form sub-lithographic patterns, while achieving very small dimensions for the region of the cell that actually changes resistivity during programming. In embodiments of the invention, the memory material may be a programmable resistive material, typically a phase change material, such as $Ge_2Sb_2Te_5$ or other materials described below. The region in the memory material element that changes phase is small; and accordingly, the magnitude of the reset current required for changing the phase is very small.

Embodiments of memory cell 64 include phase change based memory materials, including chalcogenide based materials and other materials, for memory cell 64. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys oft Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change materials are capable of being switched between a first structural state in which the material is in a generally amorphous solid phase, and a second structural state in which the material is in a generally crystalline solid phase in its local order in the active channel region of the cell. These phase change materials are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state Appropriate profiles for pulses can be determined empirically, without undue experimentation, specifically adapted to a particular phase change material and device structure.

The following are short summaries describing four types of resistive memory materials.

1. Chalcogenide Material
$Ge_xSb_yTe_z$
x:y:z=2:2:5
Or other compositions with x: 0~5; y: 0~5; z: 0~10
GeSbTe with doping, such as N—, Si—, Ti—, or other element doping may also be used.

Formation method: By PVD sputtering or magnetron-sputtering method with reactive gases of Ar, $N_2$, and/or He, etc chalcogenide at the pressure of 1 mtorr~100 mtorr. The deposition is usually done at room temperature. The collimator with aspect ratio of 1~5 can be used to improve the fill-in performance. To improve the fill-in performance, the DC bias of several ten to several hundred volts is also used. On the other hand, the combination of DC bias and the collimator can be used simultaneously.

The post deposition annealing treatment with vacuum or N2 ambient is sometimes needed to improve the crystallize state of chalcogenide material. The annealing temperature typically ranges 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

2. CMR (Colossal Magneto Resistance) Material
$Pr_xCa_yMnO_3$
x:y=0.5:0.5
Or other compositions with x: 0~1; y: 0~1
Another CMR material that includes Mn oxide may be used.

Formation method: By PVD sputtering or magnetron-sputtering method with reactive gases of Ar, $N_2$, $O_2$, and/or He, etc. at the pressure of 1 mtorr ~100 mtorr. The deposition temperature can range from room temperature to ~600° C., depending on the post deposition treatment condition. A collimator with an aspect ratio of 1~5 can be used to improve the fill-in performance. To improve the fill-in performance, the DC bias of several ten to several hundred volts is also used. On the other hand, the combination of DC bias and the collimator can be used simultaneously. A magnetic field of several ten gauss to 10,000 gauss may be applied to improve the magnetic crystallized phase.

The post deposition annealing treatment with vacuum or $N_2$ ambient or $O_2/N_2$ mixed ambient may be needed to improve the crystallized state of CMR material. The annealing temperature typically ranges 400° C. to 600° C. with an anneal time of less than 2 hours.

The thickness of CMR material depends on the design of cell structure. The CMR thickness of 10 nm to 200 nm can be used to be the core material.

A buffer layer of YBCO (YBaCuO3, a kind of high temperature superconductor material) is often used to improve the crystallized state of CMR material. The YBCO is deposited before the deposition of CMR material. The thickness of YBCO ranges 30 nm to 200 nm.

3. 2-element Compound
$Ni_xO_y$; $Ti_xO_y$; $Al_xO_y$; $W_xO_y$; $Zn_xO_y$; $Zr_xO_y$; $Cu_xO_y$; etc
x:y=0.5:0.5
Other compositions with x: 0~1; y: 0~1
Formation method:
1. Deposition: By PVD sputtering or magnetron-sputtering method with reactive gases of Ar, $N_2$, $O_2$, and/or He, etc. at the pressure of 1 mtorr ~100 mtorr, using a target of metal oxide, such as $Ni_xO_y$; $Ti_xO_y$; $Al_xO_y$; $W_xO_y$; $Zn_xO_y$; $Zr_xO_y$; $Cu_xO_y$;

etc. The deposition is usually done at room temperature. A collimator with an aspect ratio of 1~5 can be used to improve the fill-in performance. To improve the fill-in performance, the DC bias of several ten to several hundred volts is also used. If desired, they combination of DC bias and the collimator can be used simultaneously.

The post deposition annealing treatment with vacuum or $N_2$ ambient or $O_2/N_2$ mixed ambient as sometimes needed to improve the oxygen distribution of metal oxide. The annealing temperature ranges 400° C. to 600° C. with an anneal time of less than 2 hours.

2. Reactive deposition: By PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mtorr~100 mtorr, using a target of metal oxide, such as Ni, Ti, Al, W, Zn, Zr, or Cu etc. The deposition is usually done at room temperature. A collimator with an aspect ratio of 1~5 can be used to improve the fill-in performance. To improve the fill-in performance, a DC bias of several ten to several hundred volts is also used. If desired, the combination of DC bias and the collimator can be used simultaneously.

The post deposition annealing treatment with vacuum or $N_2$ ambient or $O_2/N_2$ mixed ambient is sometimes needed to improve the oxygen distribution of metal oxide. The annealing temperature ranges 400° C. to 600° C. with an anneal time of less than 2 hours.

3. Oxidation: By a high temperature oxidation system, such as furnace or RTP system. The temperature ranges from 200° C. to 700° C. with pure $O_2$ or $N_2/O_2$ mixed gas at a pressure of several mtorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mtorr to 100 mtorr is used to oxidize the surface of metal, such as Ni, Ti, Al, W, Zn, Zr, or Cu etc. The oxidation time ranges several seconds to several minutes. The oxidation temperature ranges room temperature to 300° C., depending on the degree of plasma oxidation.

4. Polymer Material

TCNQ with doping of Cu, $C_{60}$, Ag etc.

PCBM-TCNQ mixed polymer

Formation method:

1. Evaporation: By thermal evaporation, e-beam evaporation, or molecular beam epitaxy (MBE) system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of 10-4 torr to 10-10 torr. The wafer temperature ranges from room temperature to 200° C.

The post deposition annealing treatment with vacuum or $N_2$ ambient is sometimes needed to improve the composition distribution of polymer material. The annealing temperature ranges room temperature to 300° C. with an anneal time of less than 1 hour.

2. Spin-coat: By a spin-coater with the doped-TCNQ solution at the rotation of less than 1000 rpm. After spin-coating, the wafer is put to wait the solid-state formation at room temperature or temperature of less than 200° C. The waiting time ranges from several minutes to days, depending on the temperature and on the formation conditions.

For additional information on the manufacture, component materials, use and operation of phase change random access memory devices, see U.S. patent application Ser. No. 11/155,067, filed 17 Jun. 2005, entitled Thin Film Fuse Phase Change Ram And Manufacturing Method.

Is preferred that all or part of the portions of bottom electrode contacting the memory material element comprise an electrode material, such as TiN, or another conductor selected for compatibility with the phase change material of the memory material element. Other types of conductors can be used for the plug structures and the top and bottom electrodes structures, including for example aluminum and aluminum alloys, TiN, TaN, TiAlN or TaAlN. Other conductors that might be used comprise one or more elements selected from the group consisting of Ti, W, Mo, Al, Ta, Cu, Pt, Ir, La, Ni, Ru and O. TiN may be preferred because it makes good contact with GST (discussed above) as the memory material element, it is a common material used in semiconductor manufacturing, and it provides a good diffusion barrier at the higher temperatures at which GST transitions, typically in the 600-700° C. range.

The above descriptions may have used terms such as above, below, top, bottom, over, under, et cetera. These terms are used to aid understanding of the invention are not used in a limiting sense.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

The invention claimed is:

1. A method for creating a keyhole opening during the manufacture of a memory cell, comprising:

forming a base layer comprising a bottom electrode;

selecting a material for a first layer that increases its volume when subjected to a chosen process;

selecting a material for a second layer that does not increase its volume when subjected to the chosen process;

forming an upper layer on the base layer, the upper layer forming step comprising forming the second layer over the base layer and the first layer over the second layer;

forming an opening through the upper layer to expose a surface of the base layer and to create a first memory cell subassembly, the opening comprising a first, upper opening segment formed within the first layer and a second opening segment formed within the second layer, the first and second opening segments having first and second widths; and subjecting the first memory cell subassembly to the chosen process thereby increasing the volume of the first layer and creating an overhanging portion extending into the opening, the overhanging portion decreasing the size of the first opening segment to create a decreased size, keyhole opening, the first opening segment having a decreased first width, the decreased first width being shorter than the second width by an overhang dimension, the overhang dimension being no more than 10% of the second width.

2. The method according to claim 1 wherein the materials selecting step comprises selecting silicon for the first layer and the subjecting step is carried out with the chosen process being an oxidation process so to increase the volume of the silicon first layer.

3. A method for creating a self-converged void during the manufacture of a memory cell, comprising:
creating a structure according to claim 1; and
depositing a dielectric material into the keyhole opening to create a second memory cell subassembly comprising a void within the deposited dielectric material, the void being a self-converged void within the keyhole opening.

4. The method according to claim 3 wherein the self-converged void has a width which is smaller than the first width.

5. The method according to claim 1 wherein the selecting steps comprise selecting silicon for the first layer and selecting an oxide for the second layer.

6. The method according to claim 1 wherein the opening forming step is carried out to create a minimum size opening for the opening forming step.

7. The method according to claim 1 wherein the opening forming step is carried out lithographically to create a minimum lithographic size opening for the opening forming step.

8. The method according to claim 1 wherein the subjecting step is carried out so that the decreased first width is independent of the second width.

9. A method for creating a self-converged memory material element during the manufacture of a memory cell, comprising:
creating a second memory cell subassembly according to claim 3;
etching the second memory cell subassembly anisotropically, thereby forming a sidewall of the dielectric material in the keyhole opening with an electrode hole aligned with the void and exposing the bottom electrode;
depositing a memory material into the electrode hole and in contact with the bottom electrode to create a third memory cell subassembly; and
planarizing the third memory cell subassembly down into the second layer to create a fourth memory cell subassembly having a memory material element of the memory material and a flat top surface defined by the memory material element, the dielectric fill material, and the second layer.

10. A method for creating a memory cell, including a self-converged memory material element within a dielectric material, comprising:
creating a fourth memory cell subassembly according to claim 9; and
forming a top electrode on the flat top surface and in contact with the memory material element to create a memory cell.

11. A method, comprising:
providing a substrate;
forming a lower layer of a first material on the substrate;
forming an upper layer of second material over the lower layer;
forming an opening through the upper and lower layers to expose a surface of the substrate, the opening comprising an upper opening segment within the upper layer and a lower opening segment within the lower layer, the upper and lower opening segments having respective widths;
causing expansion of the upper layer by inducing a reaction of the second material with another material creating an overhang extending into the opening, the overhang decreasing the width of the upper opening segment, the decreased width of the upper opening segment being less than the width of the lower opening segment;
depositing a fill material into the opening using a conformal process creating a void within the deposited material inside the opening; and
anisotropically etching the fill material within the opening to form a more narrow opening exposing the substrate.

12. The method of claim 11, wherein the overhang decreases the width of the upper opening segment by no more than 10%.

13. The method of claim 11, including
depositing a memory material into the more narrow hole.

14. The method of claim 11, including
depositing an electrode material into the more narrow hole.

15. The method of claim 11, including
depositing a material into the more narrow hole and over the second layer to form a covering layer; and
planarizing the covering layer to form a planarized top surface.

16. The method of claim 11 wherein the material of the second layer includes silicon, and said reaction includes a reaction with oxygen that results in formation of silicon oxide.

17. A method, comprising:
providing a substrate;
forming a lower layer of a first material on the substrate;
forming an upper layer of second material over the lower layer;
forming an opening through the upper and lower layers to expose a surface of the substrate, the opening comprising an upper opening segment within the upper layer and a lower opening segment within the lower layer, the upper and lower opening segments having respective widths;
oxidizing the second material to cause expansion of the upper layer and creating an overhang extending into the opening, the overhang decreasing the width of the upper opening segment, the decreased width of the upper opening segment being less than the width of the lower opening segment;
depositing a fill material into the opening using a conformal process creating a void within the deposited material inside the opening; and
anisotropically etching the fill material within the opening to form a more narrow opening exposing the substrate.

18. The method of claim 17, wherein the overhang decreases the width of the upper opening segment by no more than 10%.

19. The method of claim 17, including depositing a memory material into the more narrow hole.

20. The method of claim 17, including
depositing an electrode material into the more narrow hole.

21. The method of claim 17, including
depositing a material into the more narrow hole and over the second layer to form a covering layer; and
planarizing the covering layer to form a planarized top surface.

22. A method for forming an opening, comprising:
providing a base layer;
forming an upper layer on the base layer, the upper layer forming step comprising forming a first layer of a first material over the base layer and a second layer of a second material over the first layer;
forming an opening through the upper layer to expose a surface of the base layer, the opening comprising an upper opening segment formed within the second layer and a lower opening segment formed within the first layer, the upper and lower opening segments having an initial upper width and an initial lower width; and
increasing the volume of the second layer using a chosen process to create an overhanging portion extending into the opening decreasing the initial upper width, wherein the first material and second material are chosen so that the overhang results from an increase in the volume of the second layer, relative to the first layer, when subjected to the chosen process.

23. The method of claim 22, wherein the first material is silicon dioxide or silicon nitride, and the second material is silicon.

24. The method of claim 22, comprising:

depositing a material conformally into the opening, resulting in formation of a void within the deposited material, the void having a width correlated with the decrease in the initial upper width caused by the overhang.

25. The method of claim 24, comprising:

etching the material within the opening anisotropically, thereby forming a sidewall of material in the opening with a more narrow hole aligned with the void and exposing the base layer;

depositing a material into the more narrow hole and in contact with the base layer.

* * * * *